(12) United States Patent
Degen

(10) Patent No.: US 10,103,629 B2
(45) Date of Patent: Oct. 16, 2018

(54) HIGH SIDE DRIVER WITHOUT DEDICATED SUPPLY IN HIGH VOLTAGE APPLICATIONS

(71) Applicant: NXP B.V., Eindhoven (NL)

(72) Inventor: Peter Theodorus Johannes Degen, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/432,797

(22) Filed: Feb. 14, 2017

(65) Prior Publication Data
US 2018/0234015 A1    Aug. 16, 2018

(51) Int. Cl.
*H02M 1/00* (2006.01)
*H02M 3/158* (2006.01)

(52) U.S. Cl.
CPC .......... *H02M 3/158* (2013.01); *H02M 3/1588* (2013.01); *H02M 2001/0006* (2013.01)

(58) Field of Classification Search
CPC ........ H02M 1/08; H02M 3/158; H02M 3/156; H02M 3/1588; H02M 3/33507; H02M 1/32; H02M 2001/327; H02M 2001/0006; H03K 2217/0081; H03K 17/687
See application file for complete search history.

(56) References Cited

U.S. PATENT DOCUMENTS

| | | | |
|---|---|---|---|
| 2005/0102128 A1 | 5/2005 | Wilhelm | |
| 2005/0168206 A1* | 8/2005 | Nadd | H02M 1/08 323/285 |
| 2006/0017466 A1* | 1/2006 | Bryson | H03F 3/2171 326/88 |
| 2007/0085488 A1* | 4/2007 | Ribarich | H05B 41/2828 315/224 |
| 2007/0108915 A1* | 5/2007 | Ribarich | H02M 1/4225 315/247 |

(Continued)

FOREIGN PATENT DOCUMENTS

KR    1020100108073 A    10/2010

OTHER PUBLICATIONS

NXP B.V., TEA19161T, Digital controller for high-efficiency resonant power supply, Product Data Sheet, Rev. 1, 46 pgs. (Mar. 10, 2016).

*Primary Examiner* — Gustavo Rosario Benitez

(57) ABSTRACT

A DC-to-DC converter is disclosed. The SMPS driver includes a highside switch having a first terminal, a second terminal and a gate. The first terminal is coupled to an input voltage terminal. The SMPS driver further includes a lowside switch having a first terminal, a second terminal and a gate. The first terminal of the lowside switch is coupled to the second terminal of the highside switch and the second terminal of the lowside switch is coupled to ground. A diode is coupled to the gate of the lowside switch on one side and to a capacitor on the other side. An integrated circuit (IC) is included to generate control signals for switching the highside switch and the lowside switch. The IC includes a highside supply pin, a highside gate control pin, a half bridge pin, a lowside gate control pin and a ground pin. The gate of the lowside switch is coupled to the lowside gate control pin, the highside supply pin is coupled to the diode and the capacitor is coupled to the half bridge pin.

19 Claims, 3 Drawing Sheets

(56) References Cited

U.S. PATENT DOCUMENTS

| | | | |
|---|---|---|---|
| 2007/0121356 A1* | 5/2007 | Lee | H02M 1/08 363/131 |
| 2009/0153223 A1* | 6/2009 | Bayerer | H03K 17/0406 327/389 |
| 2010/0321111 A1* | 12/2010 | Berkhout | H03F 3/2171 330/251 |
| 2012/0091976 A1 | 4/2012 | Chen et al. | |
| 2012/0133420 A1* | 5/2012 | Draxelmayr | H02M 3/337 327/430 |
| 2014/0021932 A1 | 1/2014 | Ejury et al. | |
| 2014/0152275 A1* | 6/2014 | Lee | G05F 1/468 323/271 |
| 2014/0159680 A1* | 6/2014 | Chiu | G05F 1/468 323/271 |
| 2015/0171750 A1* | 6/2015 | Zeng | H02M 1/08 323/311 |
| 2016/0105173 A1* | 4/2016 | De Rooij | H03K 17/6871 327/109 |

* cited by examiner

HIGH SIDE DRIVER WITHOUT DEDICATED SUPPLY IN HIGH VOLTAGE APPLICATIONS

BACKGROUND

A DC-to-DC power converter typically steps down voltage while stepping up current, from its input supply to its output load. It is a class of switched-mode power supply (SMPS) typically containing at least two semiconductors (a diode and a transistor, although modern buck converters frequently replace the diode with a second transistor used for synchronous rectification) and at least one energy storage element, a capacitor, inductor, or the two in combination. To reduce voltage ripple, filters made of capacitors (sometimes in combination with inductors) are normally added to such a converter's output and input. Switching converters provide much greater power efficiency as DC-to-DC converters than linear regulators, which are simpler circuits that lower voltages by dissipating power as heat, but do not step up output current.

There are several topologies in a power supply application. A well-known topology is the buck converter. Other topologies such as resonant, flyback or forward converter are also used. Some topologies use a low side as well as a high side switch. The disadvantage of a high side switch is that it requires a dedicated supply. For the dedicated supply, a boostrap supply circuitry, consisting of a diode and a capacitor, may be used. This circuitry needs to be supplied from a supply which output voltage is sufficient to drive the external MOSFET (typical minimum voltage 8V), but must always remain below the maximum drive voltage of the external MOSFET (typically 20V). As this voltage is not always available in a typical power supply, it needs to be either provided by the control IC or derived from a dedicated circuitry.

The disadvantage of a dedicated circuitry is the additional components, which goes at the cost of area (form factor) and costs. For this reason, several control integrated circuits (IC's) provide a dedicated supply via a dedicated pin. However, the form factor of a power supply must be minimized to such that even the pin count of a control IC must be minimized. Which then also reduces the cost even further.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a DC-to-DC converter is disclosed. The SMPS driver includes a highside switch having a first terminal, a second terminal and a gate. The first terminal is coupled to an input voltage terminal. The SMPS driver further includes a lowside switch having a first terminal, a second terminal and a gate. The first terminal of the lowside switch is coupled to the second terminal of the highside switch and the second terminal of the lowside switch is coupled to ground. A diode is coupled to the gate of the lowside switch on one side and to a capacitor on the other side. An integrated circuit (IC) is included to generate control signals for switching the highside switch and the lowside switch. The IC includes a highside supply pin, a highside gate control pin, a half bridge pin, a lowside gate control pin and a ground pin. The gate of the lowside switch is coupled to the lowside gate control pin, the highside supply pin is coupled to the diode and the capacitor is coupled to the half bridge pin.

In some embodiment, the IC includes a first driver that is coupled to the highside gate control pin, the half bridge pin and the highside supply. The first driver is controlled by a binary control signal that cause the first driver to couple the half bridge pin or the highside supply pin to the highside gate control pin. The IC also includes a second driver that is coupled to the lowside gate control pin, a switch voltage line and the ground pin. The second driver is controlled by a binary control signal that cause the second driver to couple the ground pin or the switch voltage line to the lowside gate control pin. The switch voltage line is configured to carry a switching voltage that is lower than the voltage at the input voltage terminal.

In some embodiments, the input voltage terminal is configured to accept up to 400V. The highside switch and the lowside switch are switable through a voltage in the range of 8V to 20V. The DC-to-DC converter described above may be used in high voltage circuits such as switch mode power supplies (SMPS). As used herein the term "high voltage" means a voltage that is higher than a switching voltage range of the highside or lowside switch described above.

In yet another embodiment, a DC-to-DC converter is disclosed. The DC-to-DC converter includes two highside switches, each having a first terminal, a second terminal and a gate, wherein the first terminal is coupled to an input voltage terminal. The DC-to-DC converter also includes two lowside switches, each having a first terminal, a second terminal and a gate, wherein the first terminal of the lowside switch is coupled to the second terminal of the highside switch and the second terminal of the lowside switch is coupled to ground. Two diodes are included, each coupled to the gate of one of the lowside switches on one side and to a capacitor on the other side. The DC-to-DC converter also includes an integrated circuit (IC) to generate control signals for switching each of the highside switches and each of the lowside switches. The IC includes two highside supply pins, two highside gate control pins, two half bridge pins, two lowside gate control pins and a ground pin, wherein the gate of the each of the lowside switches is coupled to one of the lowside gate control pins, one of the highside supply pins is coupled to one of the diodes and the capacitor is coupled to one of the half bridge pins.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
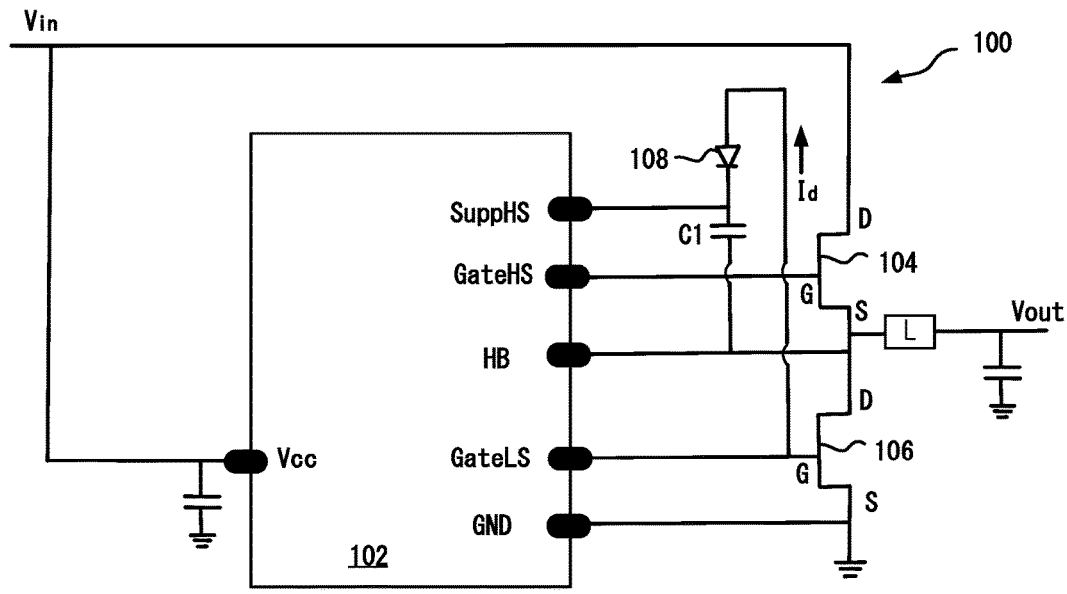
FIG. 1 depicts a schematic circuit diagram of a DC-to-DC converter including a high side driver without a need for a dedicated additional PIN in a driver integrated circuit (IC)
Figure 2:
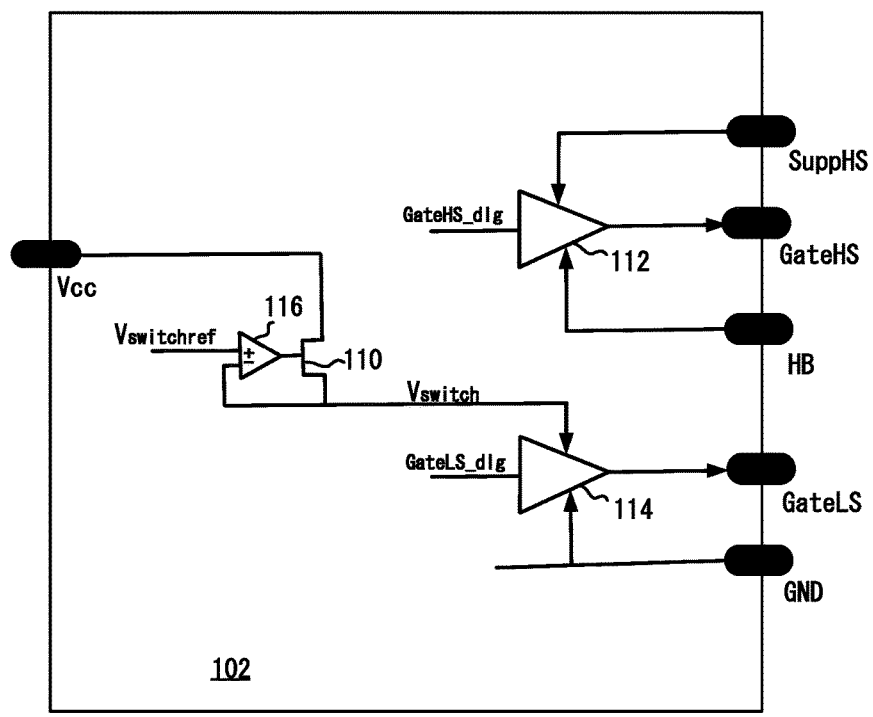
Figure 3:
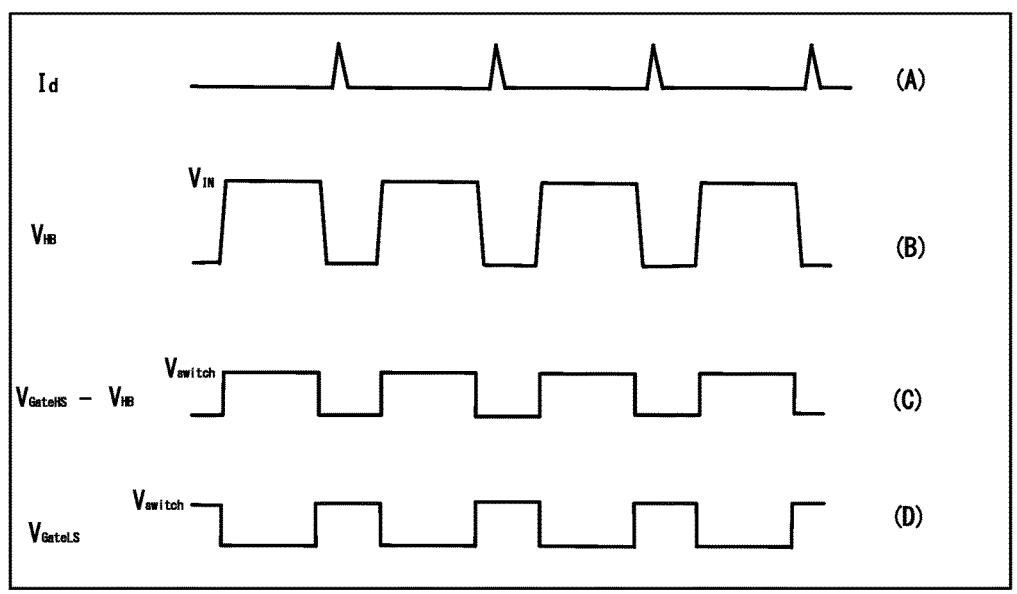

for providing dedicated supply for driving a high side transistor in accordance with one or more embodiments of the present disclosure;

FIG. 2 depicts a schematic circuit inside the driver IC in accordance with one or more embodiments of the present disclosure; and FIG. 3 depicts output graphs the high side driver circuit of FIG. 1.

Figure 4:
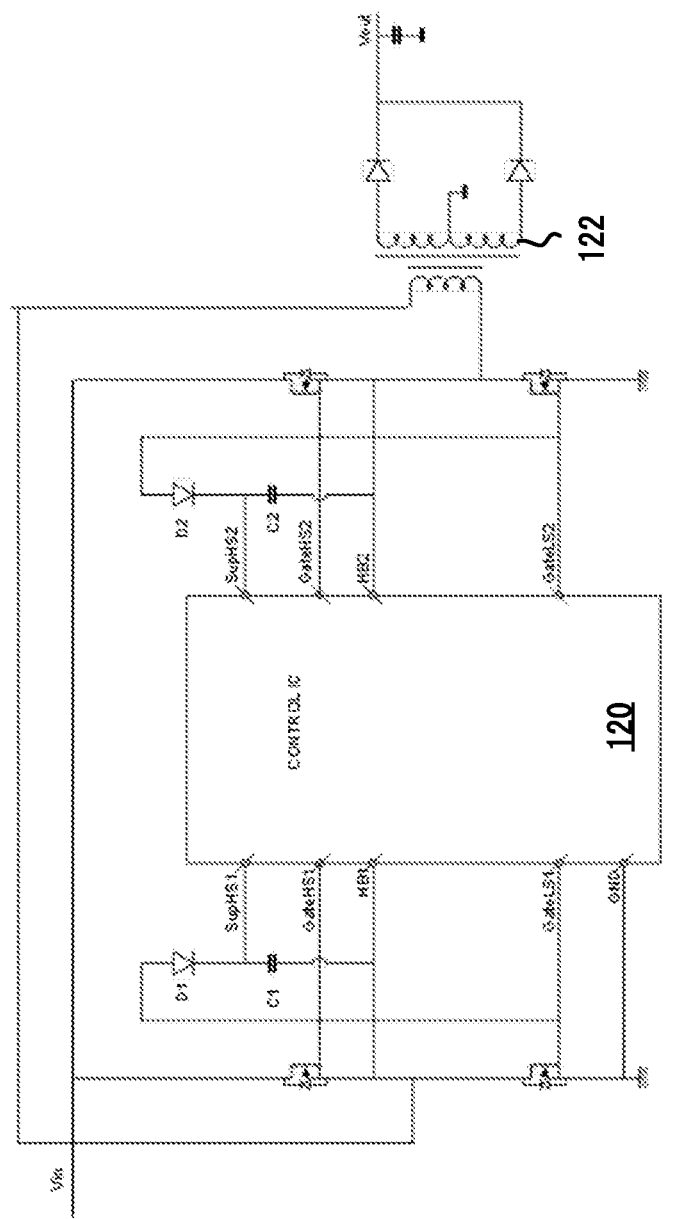

FIG. 4 depicts a DC-to-DC converter in a full bridge topology using substantially two copies of the circuit depicted in FIG. 1.

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

FIG. 1 depicts a schematic circuit diagram 100 of a DC-to-DC converter including a high side driver without a need for a dedicated additional PIN in a driver integrated circuit (IC) 102 for providing dedicated supply for driving a high side switch 104. The highside MOSFET 104 is driven by a bootstrap supply including a diode 108 and a capacitor C1. The lowside MOSFET 106 is driven by the GateLS signal and the highside MOSFET 104 is driven by the GateHS signal. The GateLS driver is supplied between ground (GND) and the Vswitch voltage. Typically, Vswitch may be 8V to 20V, but may also depends on the characteristics of MOSFETs 104, 106. When Vin is within Vswitch lower and upper ranges, the lowside MOSFET 106 may be driven by Vin itself. Also, the highside MOSFET 104 can be driven through SuppHS by connecting the diode 108 directly to Vin. However, when Vin is higher than the upper range of Vswitch, one end of the diode 108 is coupled to the GateLS PIN which is coupled to the gate of the lowside MOSFET 108. It may be noted that Vin may range from 20V to 400V. It may be noted that to limit the current $I_d$ through the diode 108, a resistor (not shown) may be place in series.

It should be noted that even though the embodiments herein are described in context of a half bridge topology, a person skilled in the art would appreaciate that these embodiments may also be equally applicable to a full bridge topology of DC-to-DC converters. As shown in FIG. 4, a full bridge topology will include two circuits 100 where the output of one circuit coupled to one end of an inductor 122 and the output of the other circuit coupled to the other end of the inductor 122. A driver IC 120 includes two driver sides, each identical to a driver side of the IC 102 to driver each other of the two half bridge circuits When the lowside MOSFET 106 is "on", the voltage at the HB (Half Bridge) PIN is approximately zero volt because HB is connected to GND through the lowside MOSFET 106. When the voltage at HB is zero the capacitor C1 is charged to Vswitch (the voltage at the GateLS PIN) via the diode 108. When the lowside MOSFET 106 (the voltage at the GateLS PIN is zero) is "off" and the highside MOSFET 104 is turned "on" through the voltage at the GateHS PIN (that is same as the voltage at the SuppHS PIN to turn the highside MOSFET 104 "on"). The SuppHS PIN supplied by the charge stored in the capacitor C1. The capacitor C1 is discharged when the capacitor C1 provides voltage to drive the highside MOSFET 104. When the GateHS is low again, the voltage at HB ($V_{BH}$) becomes low (or zero). The capacitor C1 is charged again when the GateLS goes high. As apparent, a separate driver supply is not needed for driving the highside MOSFET 104. A Vout terminal is coupled to the source of the highside MOSFET 104 through an inductor L and a capacitor. Vout is typically linear DC voltage with minimum ripples.

FIG. 2 depicts a schematic circuit inside the driver IC 102. It should be noted many components inside the IC 102 are not being shown so as not to obscure the present disclosure. The IC 102 includes a driver 112 that couples either SuppHS or $V_{HB}$ to GateHS PIN depending on whether the driver signal GateHS_dlg is high or low. The IC 102 also includes another driver 114 that couples the GateLS pin to to either the Vswitch line or the GND PIN depending on whether the signal GateLS_dlg is high or low. A comparator 116 drives a switch 110 to generate Vswitch from the input Vcc or Vin. Vswitchref is a reference voltage equal to the voltage Vswitch. Vswitchref is selected within the switching voltage range of the high and lowside MOSFETs 104, 106. Switching voltage is measured between the gate and the source of MOSFETs and this is a voltage difference between the gate and the source that is capable of turning MOSFET "on". It should be noted that Vswitch is in the range of the lower and upper switching voltages of the lowside MOSFET 106 and the highside MOSFET 104. Control signals GateHS_dlg and GateLS_dlg are generated by a control circuit (not shown) in the IC 102. When GateHS_dlg is high, GateLS_dlg is low and vice versa.

FIG. 3 depicts outputs graphs of the circuit 100. Graph A shows the current $I_d$ through the diode 108. The current $I_d$ spikes occur when the voltage at HB PIN goes down to zero when the lowerside MOSFET 106 is on. The width of the current spike in graph A corresponds to the charging time of the capacitor C1. When the capacitor C1 is fully charged, the current $I_d$ goes to zero (or substantially zero) and the capacitor C1 has voltage Vswitch across it. When the higherside MOSFET 104 is "on" and the lowerside MOSFER 106 is "off", the HB voltage is equal to Vin, as depicted in the graph B, and the GateHS voltage is $V_{HB}$+Vswitch (the capacitor C1 voltage on top of $V_{HB}$), as depicted in the graph C. Therefore, the voltage between the gate and the source of the higherside MOSFET 104 is Vswitch. The voltage at the GateLS PIN switches between Vswitch and zero, as depicted in the graph D.

The circuit 100 is therefore suitable for a wide range of Vin without making design changes or changing the lowerside MOSFET 106 and the higherside MOSFET 104 because Vswitch is independent of Vin.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A DC-to-DC converter, comprising: a highside switch having a first terminal, a second terminal and a gate, wherein the first terminal is coupled to an input voltage terminal; a lowside switch having a first terminal, a second terminal and a gate wherein the first terminal of the lowside switch is coupled to the second terminal of the highside switch and the second terminal of the lowside switch is coupled to ground; a diode coupled to the gate of the lowside switch on one side and to a capacitor on the other side; and an integrated circuit (IC) configured and arranged to generate control signals for switching the highside switch and the lowside switch via one of the control signals coupled to activate the lowside switch and to charge the capacitor, wherein the IC includes a highside supply pin, a half bridge pin, a lowside gate control pin and a ground pin, wherein the gate of the lowside switch and the capacitor are coupled to the lowside gate control pin, wherein the capacitor is configured and arranged to charge via energy from the lowside gate control pin.

2. The DC-to-DC converter of claim 1, wherein the IC includes a first driver that is coupled to the half bridge pin and the highside supply pin, wherein in response to the control signal switching, the lowside switch is configured and arranged to deactivate and the integrated circuit is configured and arranged to use the charge of the capacitor to activate the highside switch via its gate.

3. The DC-to-DC converter of claim 2, wherein the IC further includes a highside gate control pin, and the gate of the lowside switch is coupled to the lowside gate control pin, the highside supply pin is coupled to the diode and the capacitor is coupled to the half bridge pin, and the first driver is controlled by a binary control signal that cause the first driver to couple the half bridge pin or the highside supply pin to the highside gate control pin.

4. The DC-to-DC converter of claim 1, wherein the IC includes a second driver that is coupled to the lowside gate control pin, a switch voltage line and the ground pin.

5. The DC-to-DC converter of claim 4, wherein the second driver is controlled by a binary control signal that cause the second driver to couple the ground pin or the switch voltage line to the lowside gate control pin.

6. The DC-to-DC converter of claim 4, wherein the switch voltage line is configured to carry a switching voltage that is lower than the voltage at the input voltage terminal.

7. The DC-to-DC converter of claim 1, wherein the input voltage terminal is configured to accept up to 400V.

8. The DC-to-DC converter of claim 1, wherein the highside switch and the lowside switch are configured and arranged to be activated in response to a voltage at their respective gates in the range of 8V to 20V.

9. A switch mode power supply (SMPS) comprising the DC-to-DC converter of claim 1.

10. A DC-to-DC converter, comprising: two highside switches, each having a first terminal, a second terminal and a gate, wherein the first terminal is coupled to an input voltage terminal; two lowside switches, each having a first terminal, a second terminal and a gate, wherein the first terminal of the lowside switch is coupled to the second terminal of the highside switch and the second terminal of the lowside switch is coupled to ground; two diodes, each coupled to the gate of one of the lowside switches on one side and to a capacitor on the other side; and an integrated circuit (IC) configured and arranged to generate control signals, including a first control signal, for switching each of the highside switches and each of the lowside switches, wherein the IC is configured and arranged to generate the first control signal to activate the lowside switches and to charge the capacitors, wherein the IC has two highside supply pins, two highside gate control pins, two half bridge pins, two lowside gate control pins and a ground pin, wherein the gate of the each of the lowside switches and the capacitors are respectively coupled to the two lowside gate control pins, wherein the capacitors are configured and arranged to charge via energy from at least one of the lowside control pins.

11. The DC-to-DC converter of claim 10, wherein the IC includes a first driver that is coupled to one of the highside gate control pins, one of the half bridge pins and one of the highside supply pins, wherein the gate of the each of the lowside switches is coupled to one of the lowside gate control pins, one of the highside supply pins is coupled to one of the diodes and the capacitor is coupled to one of the half bridge pins.

12. The DC-to-DC converter of claim 11, wherein the first driver is controlled by a binary control signal that cause the first driver to couple one of the half bridge pins or one of the highside supply pins to one of the highside gate control pins.

13. The DC-to-DC converter of claim 10, wherein the IC includes a second driver that is coupled to one the lowside gate control pins, a switch voltage line and the ground pin.

14. The DC-to-DC converter of claim 13, wherein the second driver is controlled by a binary control signal that cause the second driver to couple the ground pin or the switch voltage line to one of the lowside gate control pins.

15. The DC-to-DC converter of claim 10, wherein the highside switches and the lowside switches are switchable through a voltage in the range of 8V to 20V.

16. The DC-to-DC converter of claim 10, wherein in response to the control signal switching, the lowside switches are configured and arranged to deactivate and the IC is configured and arranged to use the charge of the capacitor to activate the highside switches via their respective gates.

17. The DC-to-DC converter of claim 10, wherein the capacitors are configured and arranged to charge via energy from the lowside gate control pins and the IC is configured and arranged to provide a second control signal and to use the charge of the capacitors to activate the highside switches.

18. The DC-to-DC converter of claim 1, wherein the IC is configured and arranged to control the diode and the capacitor in:
   a first mode in which the capacitor is charged via energy from the lowside gate control pin; and
   a second mode in which the charge at the capacitor from the first mode is used to activate the highside switch.

19. The DC-to-DC converter of claim 18, wherein the IC is configured and arranged to control the diode and the capacitor in the second mode in response to the control signal switching and transitioning the lowside switch to deactivate.

\* \* \* \* \*